United States Patent
Dabiri (10) Patent No.: US 9,467,177 B1
(45) Date of Patent: Oct. 11, 2016

(54) PRODUCT CODED MODULATION SCHEME BASED ON LEECH LATTICE AND BINARY AND NONBINARY CODES

(71) Applicant: APPLIED MICRO CIRCUITS CORPORATION, Sunnyvale, CA (US)

(72) Inventor: Dariush Dabiri, San Jose, CA (US)

(73) Assignee: APPLIED MICRO CIRCUITS CORPORATION, Santa Clara, CA (US)

(*) Notice: Subject to any disclaimer, the term of this patent is extended or adjusted under 35 U.S.C. 154(b) by 102 days.

(21) Appl. No.: 14/466,355

(22) Filed: Aug. 22, 2014

Related U.S. Application Data (60) Provisional application No. 61/869,395, filed on Aug. 23, 2013.

(51) Int. Cl.
  *H03M 13/00* (2006.01)
  *H03M 13/29* (2006.01)

(52) U.S. Cl.
  CPC ....... *H03M 13/2906* (2013.01); *H03M 13/616* (2013.01)

(58) Field of Classification Search
  None
  See application file for complete search history.

(56) References Cited

U.S. PATENT DOCUMENTS

| | | | |
|---|---|---|---|
| 4,933,956 A | | 6/1990 | Forney, Jr. |
| 5,805,613 A | * | 9/1998 | Beery ............... H03M 13/1105 714/752 |
| 2006/0107169 A1 | | 5/2006 | Vedantham et al. |
| 2006/0159195 A1 | | 7/2006 | Ionescu et al. |
| 2010/0086171 A1 | * | 4/2010 | Lapstun ............ G06K 7/10772 382/100 |
| 2010/0307790 A1 | * | 12/2010 | Okano ................. H01B 7/361 174/113 C |
| 2011/0243566 A1 | * | 10/2011 | Truong ................. H04B 10/40 398/116 |
| 2012/0141138 A1 | * | 6/2012 | Yang .................... H04L 1/0003 398/158 |
| 2013/0064320 A1 | | 3/2013 | Nissani |

OTHER PUBLICATIONS

International Search Report & Written Opinion for PCT Application Serial No. PCT/US2015/042591, mailed Nov. 6, 2015, 10 pages.

* cited by examiner

*Primary Examiner* — Daniel McMahon
(74) *Attorney, Agent, or Firm* — Amin, Turocy & Watson LLP (57) ABSTRACT

A transceiver architecture contains an encoder and a decoder for communicating high speed transmissions. The encoder modulates signal data based on an FEC code that has a symbol size that is not matched to a symbol size of a hexacode. Any code where the symbol size is less than the sample size for coding can be serially concatenated. During decoding the multilevel decoding leech lattice and FEC decoder iteratively passes their outputs back and forth to each other until the encoded bits are decoded.

16 Claims, 9 Drawing Sheets

PRODUCT CODED MODULATION SCHEME BASED ON LEECH LATTICE AND BINARY AND NONBINARY CODES

CROSS-REFERENCE TO RELATED APPLICATION(S)

The subject application for patent claims priority to U.S. Provisional Patent Application No. 61/869,395 entitled "TRANSMISSION OVER REDUCED PAIRS OF TWI-NAX CABLES AND COMMUNICATION CODING" filed Aug. 23, 2013, which is incorporated by reference herein in its entirety and for all purposes.

TECHNICAL FIELD

The subject disclosure relates generally to transceiver communications and more particularly to communications at a high speed based on product coded modulations of leech lattice constellations with binary and non-binary codes.

BACKGROUND

Cables are often utilized as physical media to connect devices that may be networked. Signals can be sent over a physical layer of wires, for example, in which signal coding can used for enhancing the transmission. The cable can include a data link layer for messages sent between a controller (master) and a slave device. The messages could have a set of normal bits for bit synchronization, followed by a frame sync pattern, for example. The frame sync pattern, for example, can be followed by data bit frames, in which each frame could include a start bit, a bit data field, a parity bit and/or a set of fill bits of zero.

For applications requiring a high data rate with low latency performance, such as in Storage Area Networks and High Performance Computing, the interconnect media selected should have a very high bandwidth capacity, such as with twin axial (twinax) cable, to support the un-modulated baseband signal. To obtain low latency while having low power dissipation, baseband digital communication is typically used instead of a complex modulation scheme requiring sophisticated coding techniques. A drawback is media analog bandwidth. For example, in order to support 10 Gbps (Gigabit/sec) data communication, the media support a certain frequency Hertz of analog bandwidth. In order to achieve these bandwidths, the cable design and coding is refined to address performance parameters in this frequency range.

The above-described description is merely intended to provide a contextual overview of current cable interconnects and is not intended to be exhaustive. Other problems with conventional systems and corresponding benefits of the various non-limiting embodiments described herein may become further apparent upon review of the following description.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

Various embodiments for transmission coding and error correction are disclosed herein. An exemplary error correction system comprises a memory storing executable components, and a processor, communicatively coupled to the memory, that facilitates execution of the executable components. The computer executable components can comprise, for example, a concatenation component configured for stacking a set of forward error correction bits on top of each other in a matrix arrangement with a set of binary code, wherein a symbol size of the forward error correction bits is smaller than a sample size of the binary code. The components can also include an encoding component configured for generating an encoded bit for each product of a forward error correction bit and a code of the binary code.

In another embodiment, a receiver device comprises a memory to store computer-executable components, and a processor, coupled to the memory, that facilitates execution of the computer-executable components to perform operations. The computer-executable components can include an analog to digital converter component configured for receiving an analog transmission and converting the analog transmission into a set of symbols corresponding to encoded bits. The components can also include a forward error correction decoder that is configured for decoding the encoded bits using a hexacode, wherein a portion of the encoded bits are not successfully decoded. The components can also include a multilevel decoding leech lattice that is configured for receiving the decoded bits and encoded bits from the forward error correction decoder and iteratively decoding and passing the encoded bits back to the forward error correction decoder until all the encoded bits are decoded.

In another embodiment, a method comprises stacking, by a device with a processor, a set of forward error correction bits on top of each other in a matrix arrangement with a set of binary code, wherein a symbol size of the forward error correction bits is smaller than a sample size of the binary code. The method can also include generating an encoded bit for each product of a forward error correction bit and a code of the binary code.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

In consideration of the above-described trends or deficiencies among other things, various embodiments are provided for transceiver architectures that employ constellation designs based on a concatenated leech lattice with binary and non-binary codes for coded communications where significant coding gain can be achieved with a low latency decoder and a high spectral efficiency. For example, by encoding with leech lattices, high speed transmission rates can be achieved with no increases in latency or a lower latency. High speed transmission rates can also be achieved when encoding a binary code such as a BCH code even with a partial hexacode. Transmission rates such as 100 Gbps transmission rates or greater are possible for full-duplex communications over one or more communication links, such as optical communication links or a reduced number of twinaxial (twinax) pairs. For example, a cable assembly can include a set of twinaxial (or "twinax") cables that can each comprise a full-duplex or half-duplex twinax pair of conductors, optical communication links, and/or fiber optic links. The cable assembly can be configured for communicating one or more signals in two directions simultaneously at transmission speeds of 100 Gigabytes per second or greater by utilizing serially concatenated symbols, where the symbol size is less than a sample size of a binary code. The serially concatenated symbols comprise leech lattices for modulation over communication links, such as processing or transmitting communications at speeds greater than 150 Gigabytes per second or greater than 200 Gigabytes per second.

Coded lattice modulation processes described herein can be based on leech lattices, for example. A lattice can comprise a set of points in an n-dimensional real space, in which the coordinates of each point can be derived by one or more linear combinations of a predefined set of vectors. The coefficients of the one or more linear combinations can comprise integer numbers. Leech lattices can be an even unimodular lattice $\Lambda_{24}$ in 24-dimensional Euclidean space $E^{24}$. A leech lattice can comprise various characteristics and properties. For example, a leech lattice can be unimodular, and thus, can be generated by the columns of a certain 24×24 matrix with a determinant of one. The leech lattice can be even, or, in other words, the square of the length of any vector in $\Lambda_{24}$ can be an even integer. In addition, the length of any non-zero vector in $\Lambda_{24}$ is at least 2.

The constellation designs that are described can comprise translations or constructions of a basic constellations based on leech lattices embedded within the constellations that are concatenated with binary and/or non-binary codes. In one embodiment, a communication system with a processor can operate to decode a code, which is known as a hexacode ($H_6$). The hexacode is a code that is defined over an alphabet of two bits, for example. The symbols of the code can have four different values, which can be from a field denoted as {0, 1, omega, omega vector). If examining the multiple points being transported along a defined time are analyzed and the bits are analyzed that are encoded into the Hexacode with a variable FEC with the bits encoded by the hexacode, a larger coding gain can be obtained when re-encoding and decoding the receive points knowing the value of the Hexacode used in the reconstruction of the transmission. A transmission of approximately three bits per Hertz (bits/Hz) can be achieved using a lattice constellation with binary and/or non-binary codes.

Figure 1:
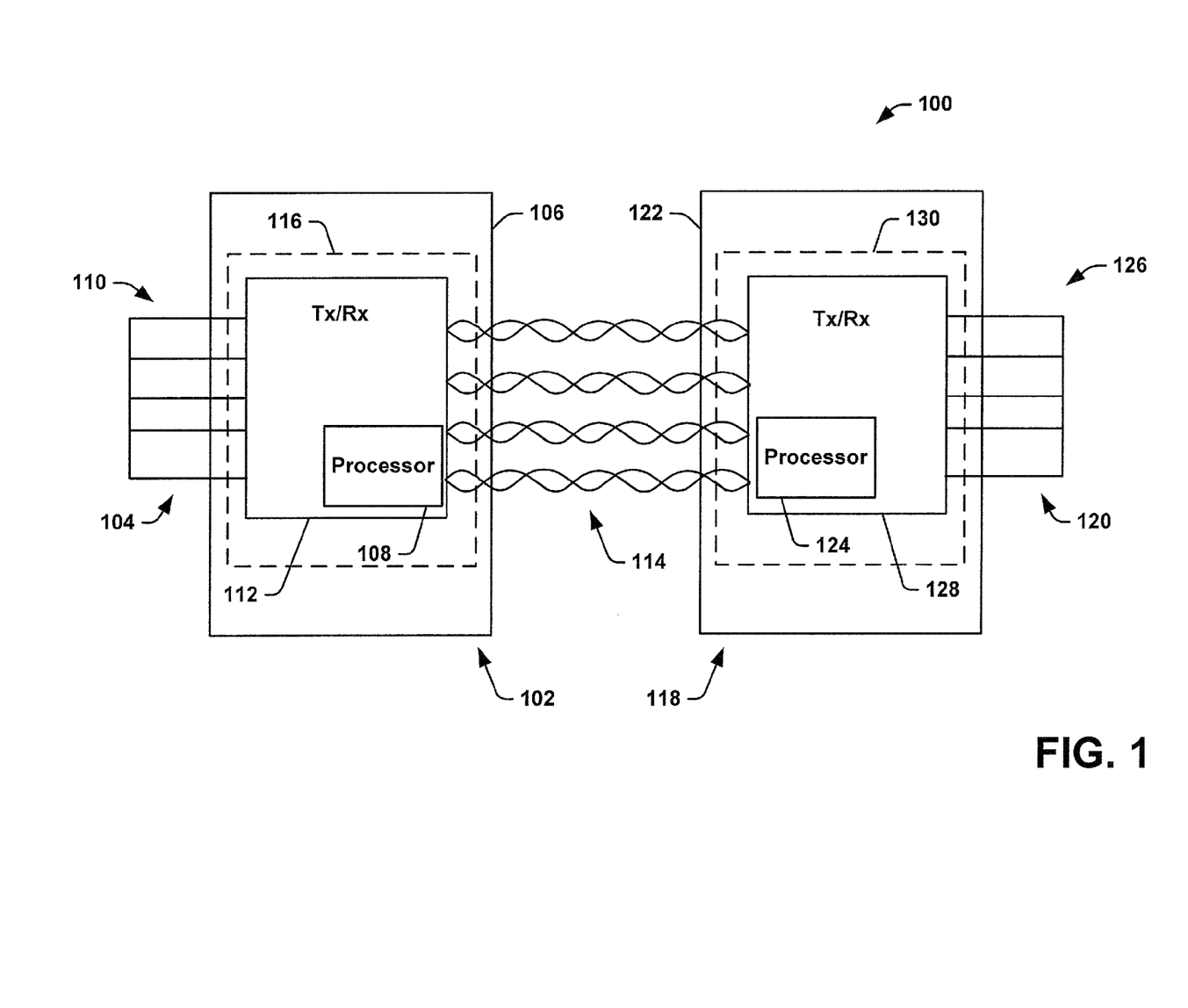
FIG. 1 is a block diagram illustrating an exemplary embodiment of an active cable assembly system in accordance with various aspects described herein.

Referring now to FIG. 1, illustrated is an embodiment of an active cable assembly 100 that can embody one or more coding modulation schemes based on product code modulation schemes using binary and non-binary codes as described herein. The cable assembly can comprise, for example, a first end device 106 and a second end device 122 for an interconnection of one or more devices (not shown), such as a computer device, mobile processing device, display device personal digital assistant, etc. The cable assembly 100 can operates as an active twinax cable device for high speed, full-duplex or half-duplex transmissions among devices or device processors with a reduced set of twinax conductor pairs for modulating communications based on constellation designs for an increase in coding gain and high spectral efficiency. Additionally, the cable assembly 100 can operate to simultaneously transmit and receive data at a transmission speed of 100 Gbps or greater for one or more different communication protocols via a communication link such as via wired and/or optical link communications to maintain or decrease latency in encoding and decoding processes.

For example, the cable assembly 100 can comprise an interface 110 and an interface 126 at each end that can include a set of interconnects 104, 120 (e.g., copper interconnects or optical links) that can operate to interface with a receiving port or a plug such as a Quad Small Form-factor Pluggable (QSFP), a Small Form-factor Pluggable, or other pluggable connector. The interface 110 and 126 can be operatively connected to a circuit board 116 and 130 or a surface mount or processor package mount (e.g., a ball grid array or the like) having a processor 108 and 124. The interface 110 and 126 can also include a plug portion (not shown) of the cable assembly 100, which operates as a mate for connection to a plug or port of a device or processing device for communication between one or more other devices. The cable assembly 100 can be operable as an active cable device that draws or consumes power at one or more ends of the assembly 100, and further processes, encodes and decodes transmissions of one or more communications based on a serially concatenated leech lattice made in part of a partially known hexacode with low bit error rates and high efficiency.

The cable assembly 100 can comprise a plug assembly 102 and 118 at an end of the cable assembly 100 that comprises the plug portion or the interface 110 that operates as the mate for connection to a plug or port of a device. The plug assembly 102 or 118 can comprise a processor 108 or 124 operatively connected to the circuit board 116, 130 or a surface mount respectively. The processor 108 or 124 can operate with a transceiver 112, 128 to encode, decode, partition, or process error correction code (ECC) such as Forward Error Correction Code (FEC) according to one or more algorithms that can enable high speed, full-duplex transmissions of data at 100 Gbps or greater Gbps via the twinax pairs 114 based on leech lattice constellations.

The processors 108 or 124 can operate to draw or consume power from an independent power source (not shown) located internally, which can be coupled to the circuit board or processor package 116, 130. In addition or alternatively, the signals being transmitted can be used to power the communication link or cable. For example, a power signal transmission can be utilized to power the processors 108 or 124 for transmission, such as by an electrical connection, inductive coupling or other remote power delivery means. A power source from the device coupled to the cable assembly can also be utilized to power the processors 108, 124, such as from an external power source located on the device. Alternatively, the cable assembly 100 can operate as a passive device where the processor and signal processing infrastructure is located on the connected devices, and where the cable assembly does not have a power source and draws power from one or more connected devices.

The processors 108 and 24 can be further integrated as transceiver processors that operate to communicate (transmit and/or receive) signals for full-duplex transmissions along the twinax pairs. In addition or alternatively, the processors 108 and 124 can be coupled to a transmitter, receiver, or transceiver 112, 128 located within the plug assembly 102, 118. For example, a transceiver 112, or 128 can be coupled to the processors on the circuit board 116 or 130 via routed traces or a processor package having connect pads, ball grid array, or other like interconnects mounted on the circuit board 116, 130 (e.g., a printed circuit board) of the cable assembly 100.

In one embodiment, high-speed transmission architecture of the cable assembly 100 can be based on a leech lattice comprising stacked forward error correction bits that are encoded by a binary code. For example, a transceiver architecture having the transceiver 112 and/or 128 can employ a constellation design where significant coding gain is achieved with low latency decoding processes and high spectral efficiency. This embodiment can be applied where coding gain is desired at high speed applications where because of bandwidth limitations there is a need for high spectral efficiency and at the same time the latency of the decoding processes can be minimized. This high spectral efficiency increases the number of bits per bandwidth while maintaining requirements for a set of links, channels or twinax pairs 114, for example.

A lattice, for example, can comprise a set of the points in an n-dimensional real space, where the coordinates of each point are derived by one or more linear combinations of a predefined set of vectors where all the coefficients of the linear combination can comprise integer numbers. A leech lattice can operate to achieve a maximum spatial density in twenty-four dimensions. The current methods that rely on simple constellations such as PAM-n, do not achieve coding gain from the constellation. Rather, coding gain is achieved by using long algebraic codes such as Reed-Solomon (RS) codes. These long algebraic codes suffer from a long latency. In addition, trellis coded modulation codes or TCM codes are not always suitable for high speed implementations, since reducing the latency for such decoders can result in a rapid increase in their complexity.

For example, a twenty-four dimensional array of modulated symbols (e.g., PAM-4 symbols) can be analyzed within those steps for encoding/decoding communication signals over the pairs or the optical communication links 114. The constellation diagram can comprise modulation points (e.g., pulse-amplitude modulation (PAM) points) or symbols where communicated data, a set of signals, or, in other words, message information is encoded in the amplitude of a series of signal pulses. In an analog pulse modulation processes or scheme the amplitudes of a train of carrier pulses can be varied according to the sample value of the message signal. For example, the transceiver 112, 128 can include a two-bit modulator (PAM-4) (not shown) that can operate to process two bits at a time and map the signal amplitude to one of four possible levels, for example −3 volts, −1 volt, 1 volt, and 3 volts. Demodulation can be performed by detecting the amplitude level of the carrier at every symbol period, for example. The transceiver 112, 128 can operate to generate a twenty-four dimensional array of PAM-4 symbols, which can then be analyzed for further coding.

In another embodiment, the leech lattice can be concatenated with binary and non-binary codes. The transceivers 112, 128 can operate to generate FEC encoding for mapping operations. The mapping operations can utilize an FEC code rate output that can include a rate of one-half. The rate of the FEC coding (e.g., 32/64 for one below example) can be one-half, which is the sum of the information symbol bits (e.g., 32) divided by the length of the code (e.g., 64). The transceivers 112, 128 can then output twenty-four symbols, for example, based on a concatenated leech lattice of the constellation or constellation diagram.

On the transmit side, when encoding bits to a Leech lattice multiple steps are taken to define the points (modulated points) selected, which defines a partition of the points in a 24 dimensional space. Alternatively, the space can be a twelve two dimensional space, or twelve two dimensional partitions. The transceivers 112, 128 of the system can further operate to decode a code which is known as a hexacode ($H_6$). The hexacode is a code that is defined over an alphabet of two bits. The symbol can have four different values, which can be from a field denoted, for example, as {0, 1, omega, omega vector}. If examining the multiple points being transported along a defined time and the coded bits are analyzed that are encoded into the hexacode with a variable FEC with the bits encoded by the hexacode, a larger coding gain can be obtained when re-encoding and decoding the receive points knowing the value of the hexacode used in the reconstruction of the transmission. A transmission of approximately three bits per Hertz (bits/Hz) can be achieved using a concatenated lattice constellation with binary and non-binary codes. An FEC encoder, for example, can add FEC code on top of the transmission that can thus allow extra protection to certain bits that enables an efficient decoding of the receive points.

In one example, the hexacode can be denoted as (6, 3, 4), in which the number of bits comprise six bits in length, the number of the information symbols is three, and the minimum Hamming distance of the codes is equal to four.

Because the number of information symbols is three, for example, and the symbols comprise two bits each, then six bits can uniquely specify the encode rules in the hexacode. In other words, the hexacode can comprise sixty-four code words.

In one aspect of the embodiment, a speed of three bits per Hertz is achieved through the twenty-four dimensions of the Leech Lattice, which results in 24 symbols that will be transmitted from a mapper or a mapping component, for example, which is further discussed infra. The three bits per Hertz computes to three times a product of a dimensional space (e.g., 24) for a number of bits to be transmitted (e.g., 72) with 12 bits that can be transmitted. The rate of the transmission can be determined, for example, by examining sixteen layer constellations or a path 16 constellation of the code.

Figure 2:
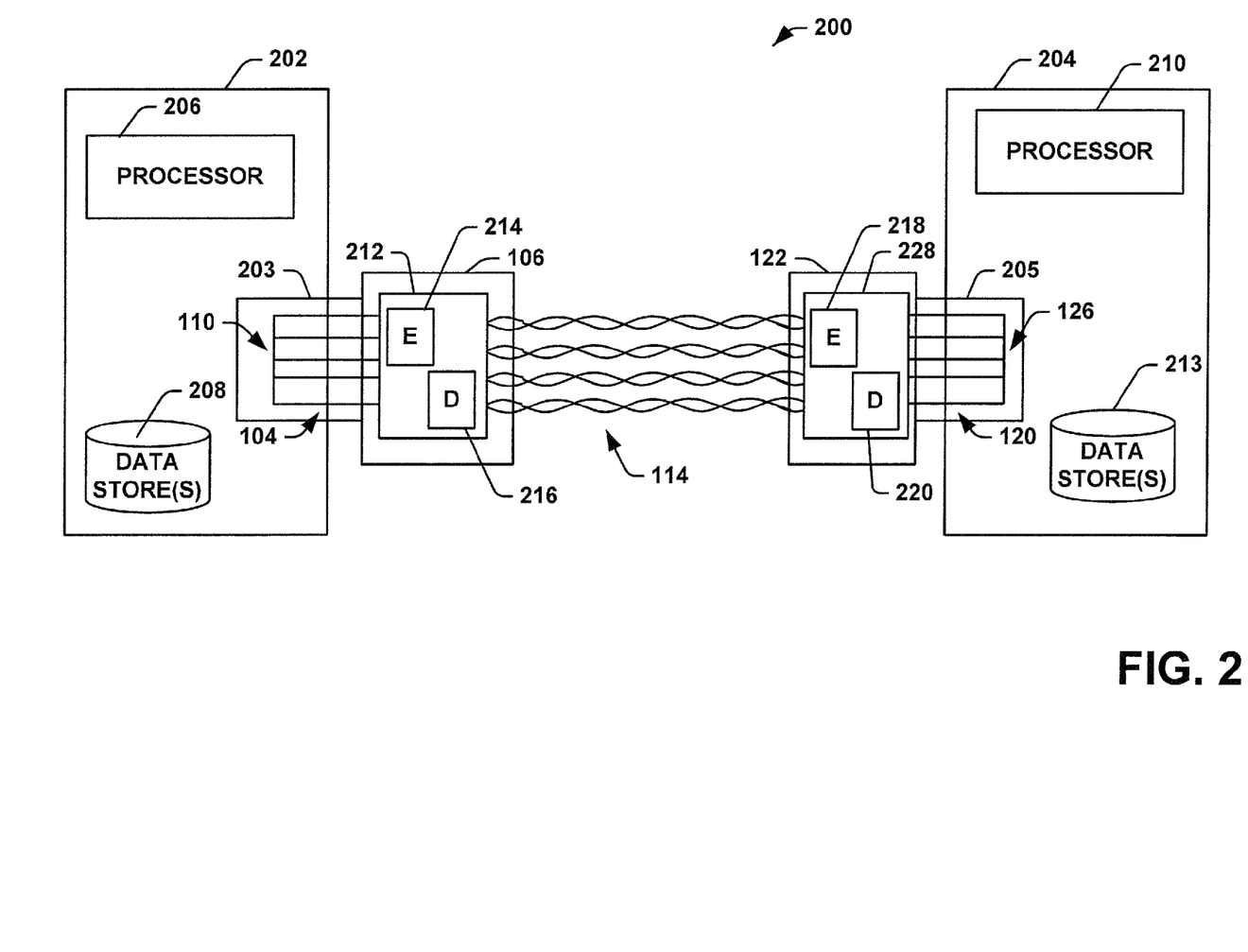
FIG. 2 is a block diagram illustrating an exemplary embodiment of a cable assembly system with transceiver architecture in accordance with various aspects described herein.

Referring now to FIG. 2, illustrated is an example of a cable assembly 200 that operates at high speed transmission for transmitting and receiving data back and forth from one or more devices by utilizing a concatenated leech lattice configured within constellations with binary and/or non-binary codes. In an embodiment, the cable assembly 200 can be a passive cable assembly. The cable assembly 200 comprises similar components as discussed above with regard to FIG. 1 and further includes encoding components and decoding components mounted on a surface mount or circuit board 106 and 122, for example, within plug assemblies, which can encode and decode communication data or signals based on a concatenated leech lattice constellation.

The cable assembly 200 can be operatively coupled to a first device 202 and a second device 204 via a plug 203 and a plug 205, which can comprise a receiving port, for example, which can be a Quad Small Form-factor Pluggable (QSFP), a Small Form-Factor Pluggable (SFP) port, a Small Form Factor SFF casing, or other receiving port configured for wired and/or optical links. The first device 202 or the second device 204 can respectively comprise a processor 206, 210 and one or more data stores 208 and 213. The first device 202 or the second device 204 can comprise a processing device such as a personal computer device, a mobile device, an input/output device, a display, a personal digital assistant, or other similar device operable for communicating via the plug 203 or 205.

A surface mount or electronic board 106 and 122 of plug assemblies at opposite ends of the twinax pairs 214 can comprise transmitters 212 and 228, which can include encoders 214 and 218 and decoders 216 and 220 respectively that are operatively coupled to a processor and/or transceiver architectures on circuit boards or respective mounting assemblies. The encoders 214 and 218, for example, can operate to encode at least a part of information of signals from one format, code or communication protocol to another via one or more algorithms based on a leech lattice constellation. The decoder 216 or 220 can operate to reverse the operation of the encoder in order to convert the information from one format or protocol into another format or protocol. For example, the decoder 216 or 220 can operate to convert binary/non-binary information from a number of lines to a unique output line or lines. For example, in cases where one or more encoders encode data from the first device 202 into one format for high speed transmission, the decoder 220 can operate to decode and/or re-code the data based on the second device 204 being a different device operating in a different communication protocol according to concatenated leech lattices of constellations.

Another embodiment of the transceiver architectures 212 and 228 can employ constellation processes as described above. The encoder 214 or 218 can operate to map a constellation diagram as representation of a signal modulated by a digital modulation scheme such as a pulse amplitude modulation, quadrature amplitude modulation, phase-shift keying, etc., for example. The constellation diagram can be a diagram or other representation of a set of signals to be transmitted as a dimensional scatter diagram in the complex plane at symbol sampling instants. For example, a twenty four dimension vector of pulse amplitude modulation points can be mapped to lie on a concatenated leech lattice. In a more abstract sense, the constellation/constellation diagram can represent the possible symbols that may be selected by a given modulation scheme as points in a complex plane. Further, the encoders 214 and 218 can be utilized to determine measurements of constellation diagrams to recognize the type of interference and distortion in a signal by the transmitters 212 and 228. By representing a transmitted symbol as a complex number and modulating a cosine and sine carrier signal with the real and imaginary parts (respectively), the symbol can be sent with two carriers on the same frequency, for example, such as quadrature carriers. The use of two independently modulated carriers is the basis of quadrature modulation. In addition, phase modulation can be utilized where the phase of the modulating symbol is the phase of the carrier itself, as well as pulse amplitude modulation where the signals are encoded in the amplitude of a series of signal pulses.

As the symbols are represented as complex numbers, they can be visualized as points on the complex plane. The real and imaginary axes can be the in phase, or I-axis, and the quadrature, or Q-axis, respectively. Plotting or mapping several symbols in a scatter diagram produces the constellation or diagram. The points on a constellation diagram are called constellation points (points). They are a set of modulation symbols which comprise the modulation alphabet.

The encoders 214 and 218 can operate to map constellations based on leech lattices with a twenty four dimensional array of symbols (e.g., PAM-4 symbols), and further operate to pre-code the symbols such as by Tomlinson-Harashima pre-coding, such as to pre-cancel known interference without a power penalty, for example. The encoders 214 and 218 can operate to linearly filter the pre-coded signals by processing the signals as time-varying input signals to produce output signals subject to a constraint of linearly. The linearly filtered signals could then be used for purposes of channel equalization as well as other optimization techniques, for example. In addition, the output of the linear filtering can be used to drive a digital to analog conversion process or line driver operations.

The decoders 216 and 220 can operate to receive the encoded signal on an analog front end and process the signals with a programmable gain and an analog to digital conversion process. The receive pathway of the decoders 216 and 220 can include a phase locked loop, for example, that generates an output whose phase is related to the phase of the input signal or for the purposes of a clock recovery process. The receive pathway of the decoders 216 and 220 can be a digital receive path that provides linear equalization processes and detector algorithms to reduce the bit error rate in detecting the constellation points based on the leech lattice transmitted. The decoders 216 and 220 can operate to provide a phase detection of the transmitted signals for detecting timing differentials between a received signal and a detected signal to drive a clock recovery loop. The output can then be applied to forward error correction decoding processes for controlling errors in data transmission.

Figure 3:
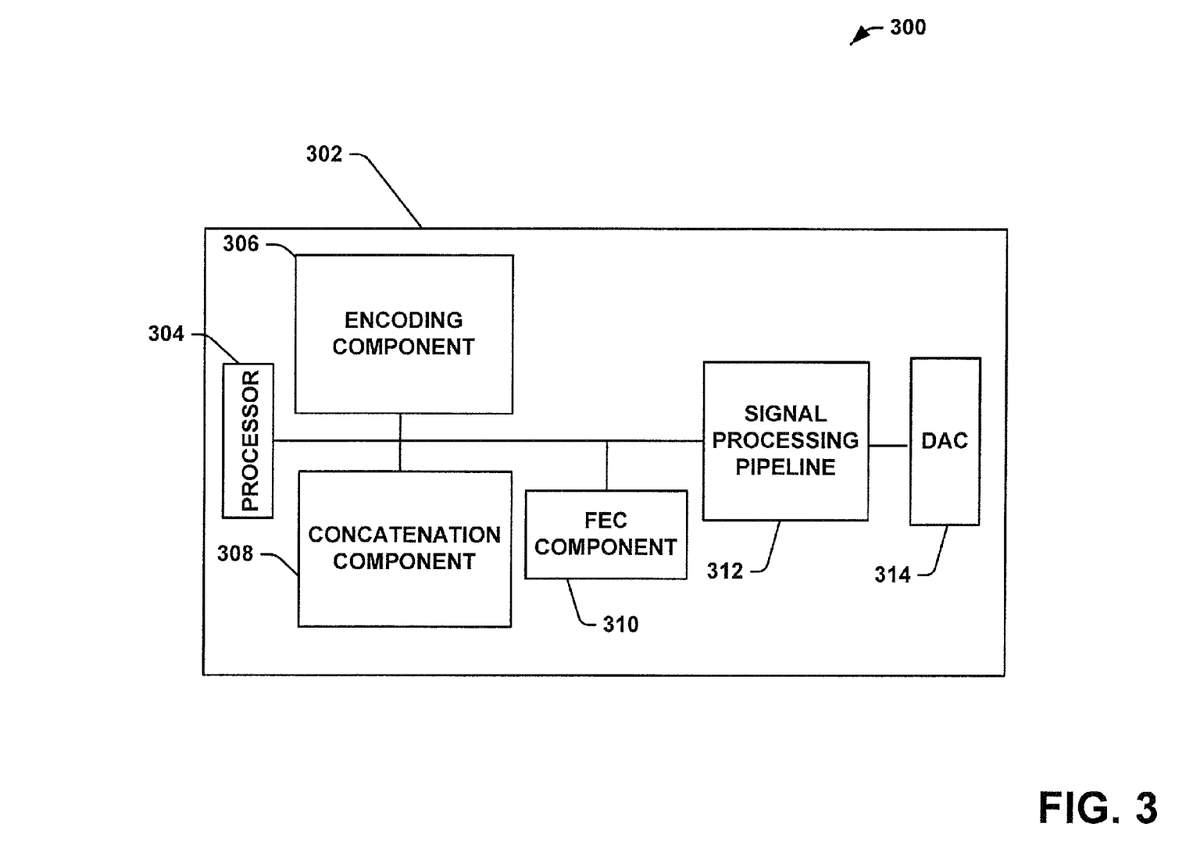
FIG. 3 is a block diagram illustrating an exemplary embodiment of a transmit path of transceiver architecture in accordance with various aspects described herein.

Referring to FIG. 3, illustrated is a block diagram 300 illustrating an exemplary embodiment of a transmit path of transceiver architecture 302 for encoding and communicating signals based on a serially stacked/concatenated leech lattice constellation with binary and non-binary codes. On the transmit path of the transceiver device 302, for example, an encoding component 306, which can be executed by processor 304, can operate to generate FEC codes and encode modulated signal points, (e.g., pulse amplitude modulated points of signals, or the like), in a constellation according to a concatenated Leech lattice with binary and non-binary codes. In an embodiment, the encoding component 306 can generate an FEC code where a symbol size of the FEC is not matched to the number of hexacode symbols. This FEC code, or the FEC bits can be smaller than the sample size of the code.

In order to make this smaller sized FEC code usable, concatenation component 308 can be provided to serially stack the six bits of the FEC code on top of each other in the arrangement (e.g., a matrix arrangement, index arrangement, or the like) or product code structure. Although there are six bits, since the symbol size of the FEC code is smaller than the hexacode symbols, only a portion of the bits are coded. Once stacked, the encoding component 306 can generate an encoded bit for each product of a forward error correction bit and a code of a binary code (such as a BCH code), resulting in less than six encoded bits for each code of the binary code.

In an example, the horizontal portion or row of an arrangement could be 1024 bit BCH or other binary code that is encoded at a certain rate. Each column in the decoding process could encode the FEC bits with the codes of the binary code to generate the encoded bits. Some of the columns in the decoding process would be successful and some would be unsuccessful depending on how many FEC symbols there are. If the difference between the symbol size of the generated FEC code is greater, there can be more unsuccessful decodings, thus introducing greater latency.

An FEC component 310 can generate an output that can operate to designate and communicate an FEC rate (e.g., one-half). The rate of the FEC coding (e.g., 32/64) can be one-half, for example, in which the rate can be the sum of the information symbol bits (e.g., 32) divided by the length of the code (e.g., 64).

Once the encoding component encodes the encoded bits, the signal processing pipeline 312 can prepare the signal for transmission and DAC 314 can convert the digital signal to an analog signal for transmission over the at least two pairs of twinax cabling.

Figure 4:
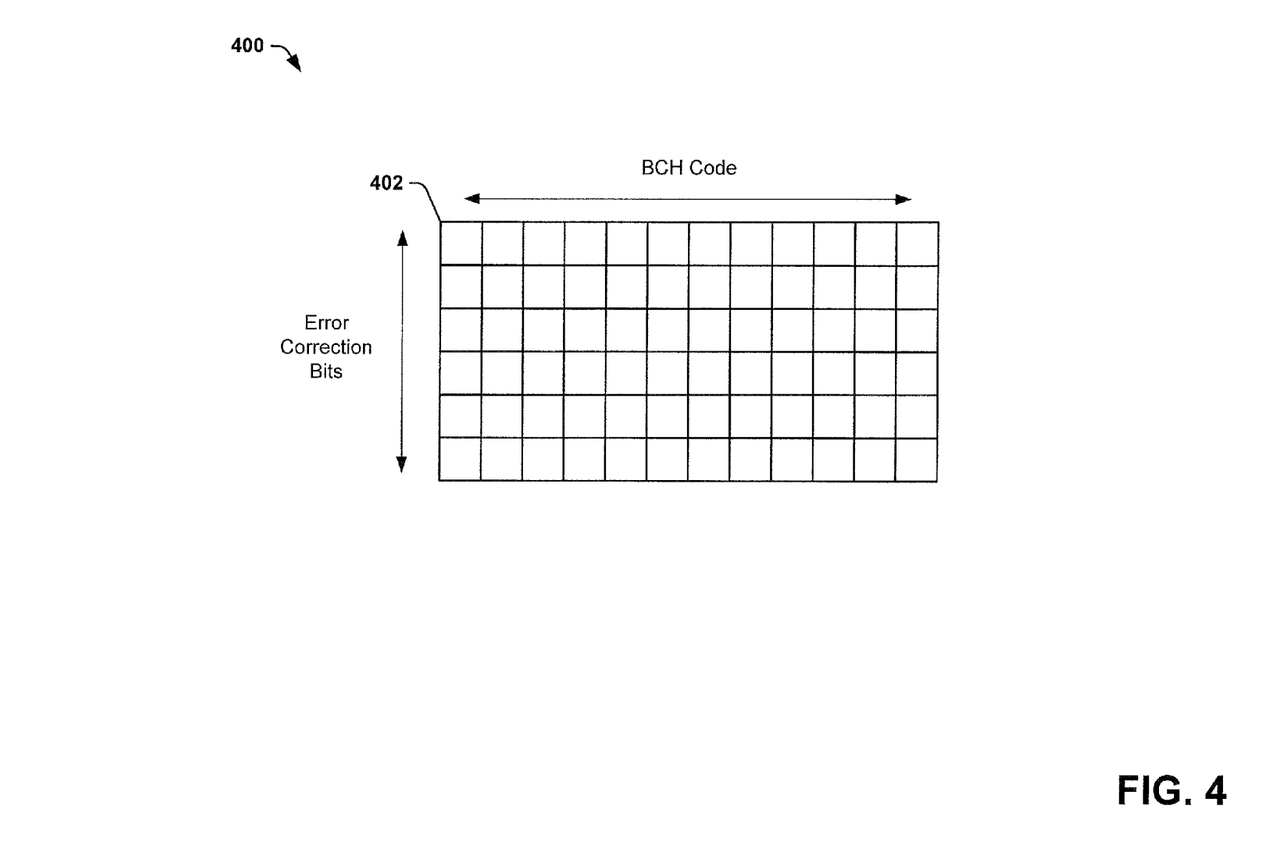
FIG. 4 is a block diagram illustrating an exemplary embodiment of a serially concatenated lattice in accordance with various aspects described herein.

Turning now to FIG. 4, illustrated is an exemplary embodiment of a serially concatenated lattice 402 in accordance with various aspects described herein. The forward error correction bits can be stacked on top of each other. There can be six rows representing the bits of a hexacode, even if the symbol size of the FEC code is smaller than the symbol size of a hexacode—the rows can remain empty and only filled with as many symbols as there are in the FEC code. These FEC bits are then encoded with the binary code (or BCH code) for as many bits as there in the binary code. The resulting product code is then concatenated into a leech lattice for transport to the receiver.

Figure 5:
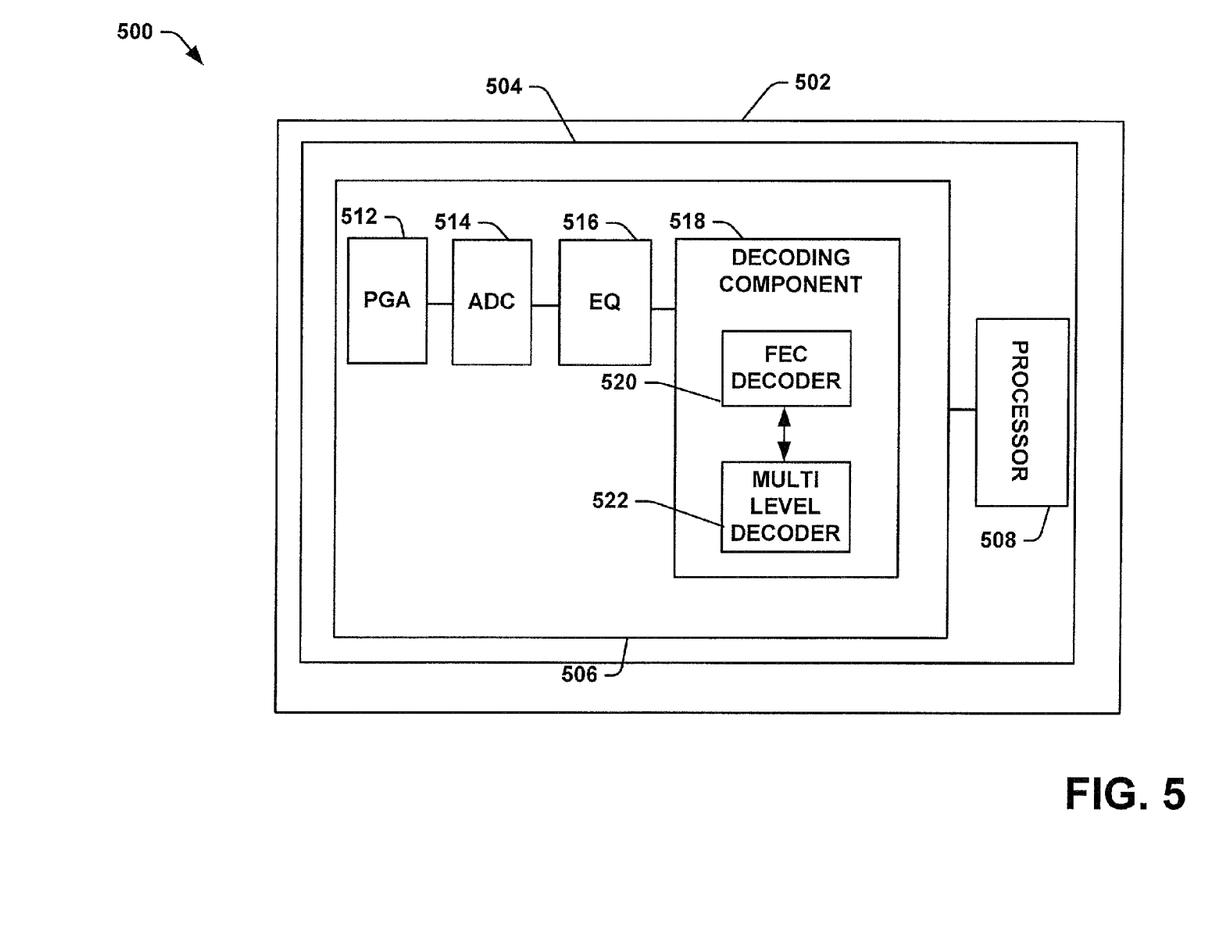
FIG. 5 is a block diagram illustrating an exemplary embodiment of a receive path of transceiver architecture in accordance with various aspects described herein.

Turning now to FIG. 5, illustrated is an embodiment for processing high speed signals based on concatenated leech lattice constellations to enable a coding gain at a decoding stage. A cable assembly 500 comprises a plug assembly having a mount, board, wafer package or processing device 504 that includes a transceiver device 506 and a processor 508. The transceiver device 506 can comprise a programmable gain amplifier (PGA) 512, an analog-to-digital converter (ADC) 514, an equalizer component 516, and an FEC Decoder 518. The transceiver device can receive a signal sent over at least one pair of twinax or optical cables that communicate (transmit and receive) in a full-duplex mode of transmission as a communication link, for example, to and from the transceiver component 506. The signal can be amplified by the PGA 512, converted from analog to digital by the ADC 514, equalized by the equalizer 516 and further decoded by the FEC decoder 518 for 80 Gbps or 100 Gbps and greater transmissions.

On the receiver side when transmissions reach the FEC decoder 518, the encoded bits of the concatenated leech lattice can be decoded to correct for any errors. Since there were a smaller number of FEC bits than a symbols size of the hexacode, attempts to decode the columns of the leech lattice will only be partially successful. The FEC decoder 520 can perform the partial decoding of the columns and then pass the remaining encoded bits to multi-level decoding leech lattice 522. Decoding is then performed in an iterative fashion as the output of each of the FEC decoder 520 and the multi-level decoding leech lattice 522 are passed back and forth to each other until all the encoded bits are decoded. The latency of this decoding can be based on a difference in the symbol size of the forward error correction bits and the sample size of the binary code.

Example Methods of Full Duplex Transmission Over Reduced Pairs of Twinax Cables

While the methods or process flows described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 6:
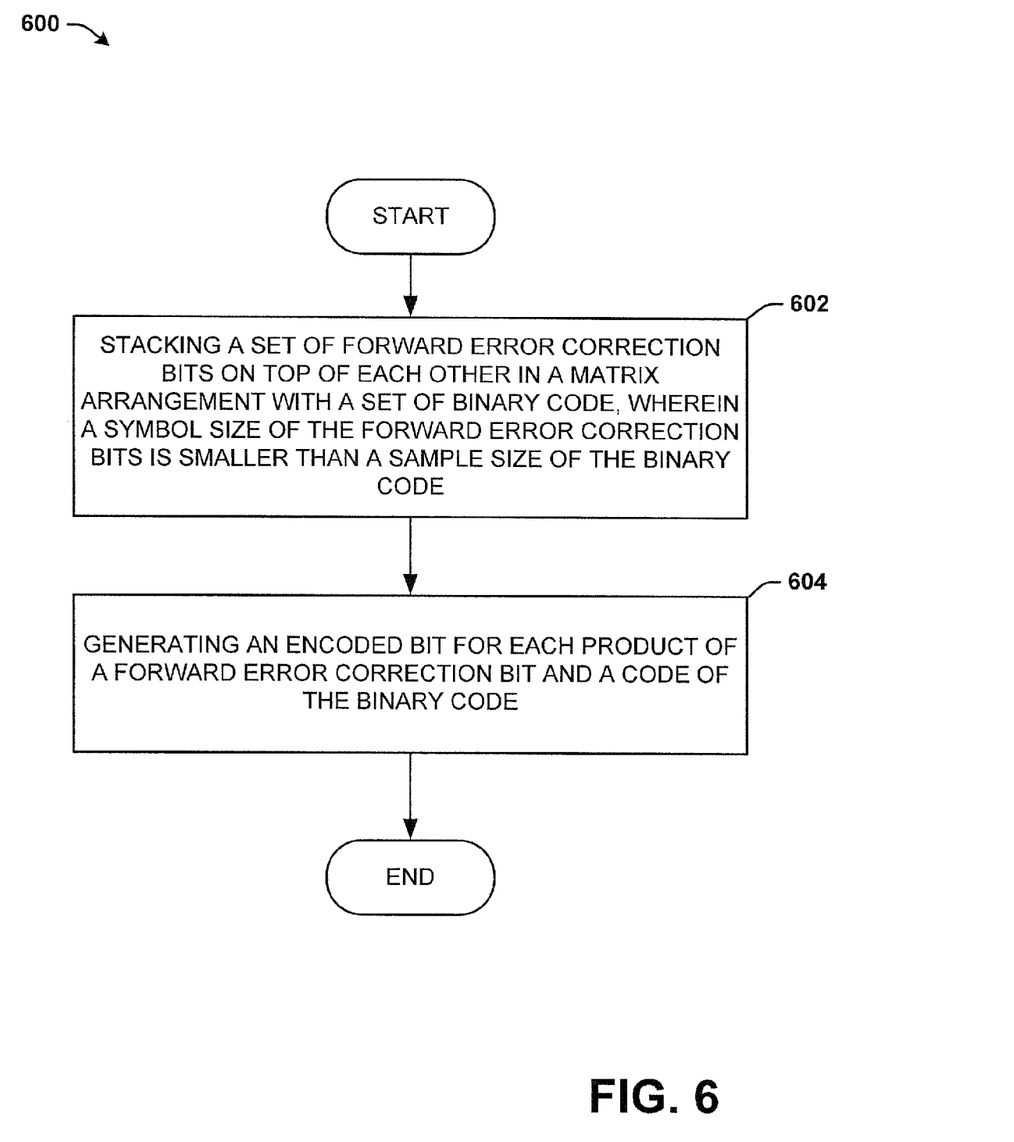
FIG. 6 illustrates an example of a flow diagram of a receive path of transceiver architecture in accordance with various aspects described herein.

FIG. 6 displays an example of a flow diagram 600 of a receive path of transceiver architecture in accordance with various aspects described herein.

At 602, the method comprises stacking, by a device with a processor, a set of forward error correction bits on top of each other in a matrix arrangement with a set of binary code, wherein a symbol size of the forward error correction bits is smaller than a sample size of the binary code.

At 604, the method comprises generating an encoded bit for each product of a forward error correction bit and a code of the binary code.

Figure 7:
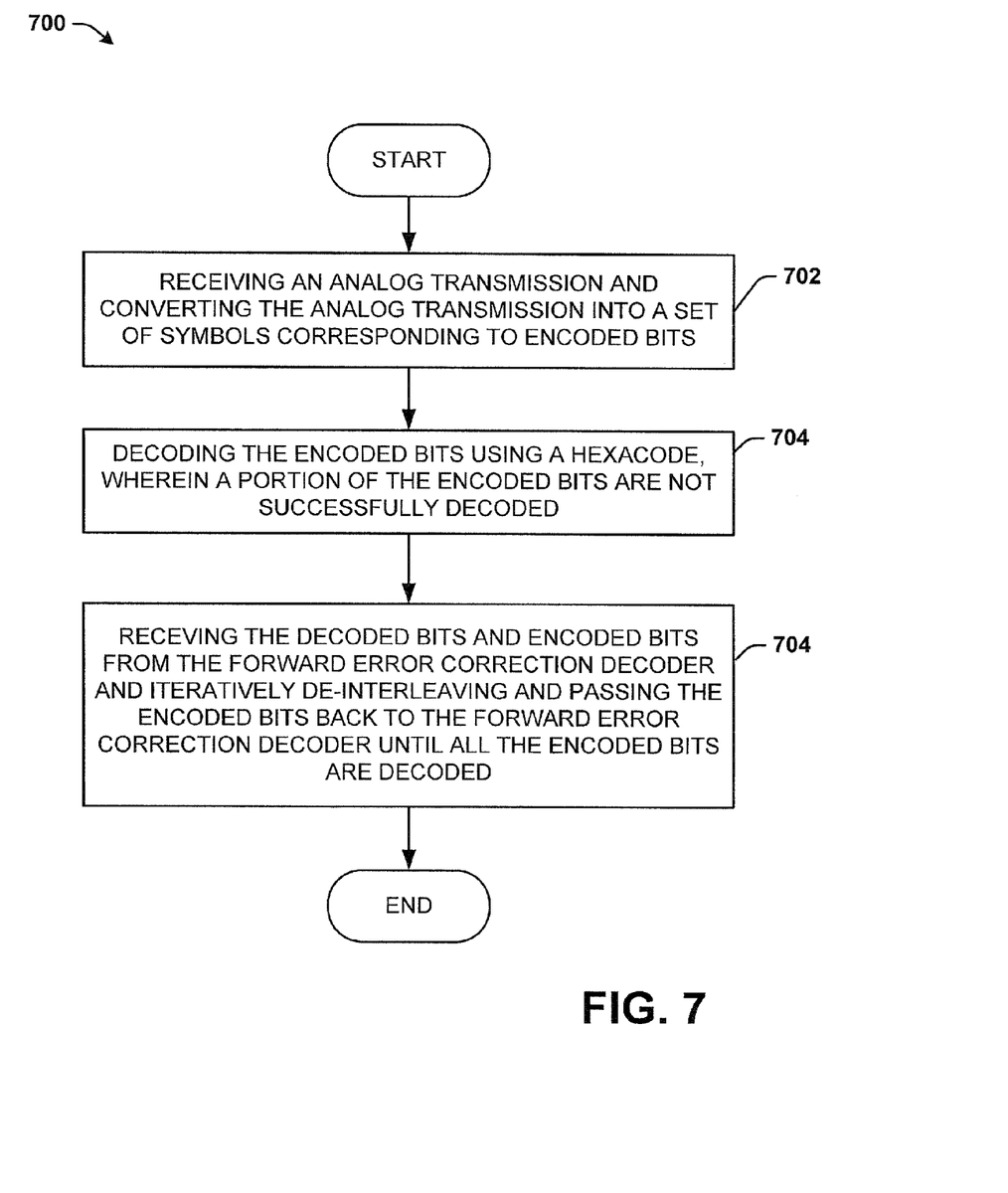
FIG. 7 illustrates an example of a flow diagram for a cable assembly system in accordance with various aspects described herein.

FIG. 7 displays an example of a flow diagram 700 of a receive path of a cable assembly system in accordance with various aspects described herein.

At 702, the method comprises receiving an analog transmission and converting the analog transmission into a set of symbols corresponding to encoded bits. At 704, the method comprises decoding the encoded bits using a hexacode, wherein a portion of the encoded bits are not successfully decoded. At 706, the method comprises receiving the decoded bits and encoded bits from the forward error correction decoder and iteratively decoding and passing the encoded bits back to the forward error correction decoder until all the encoded bits are decoded.

Example Networking Environment

Figure 8:
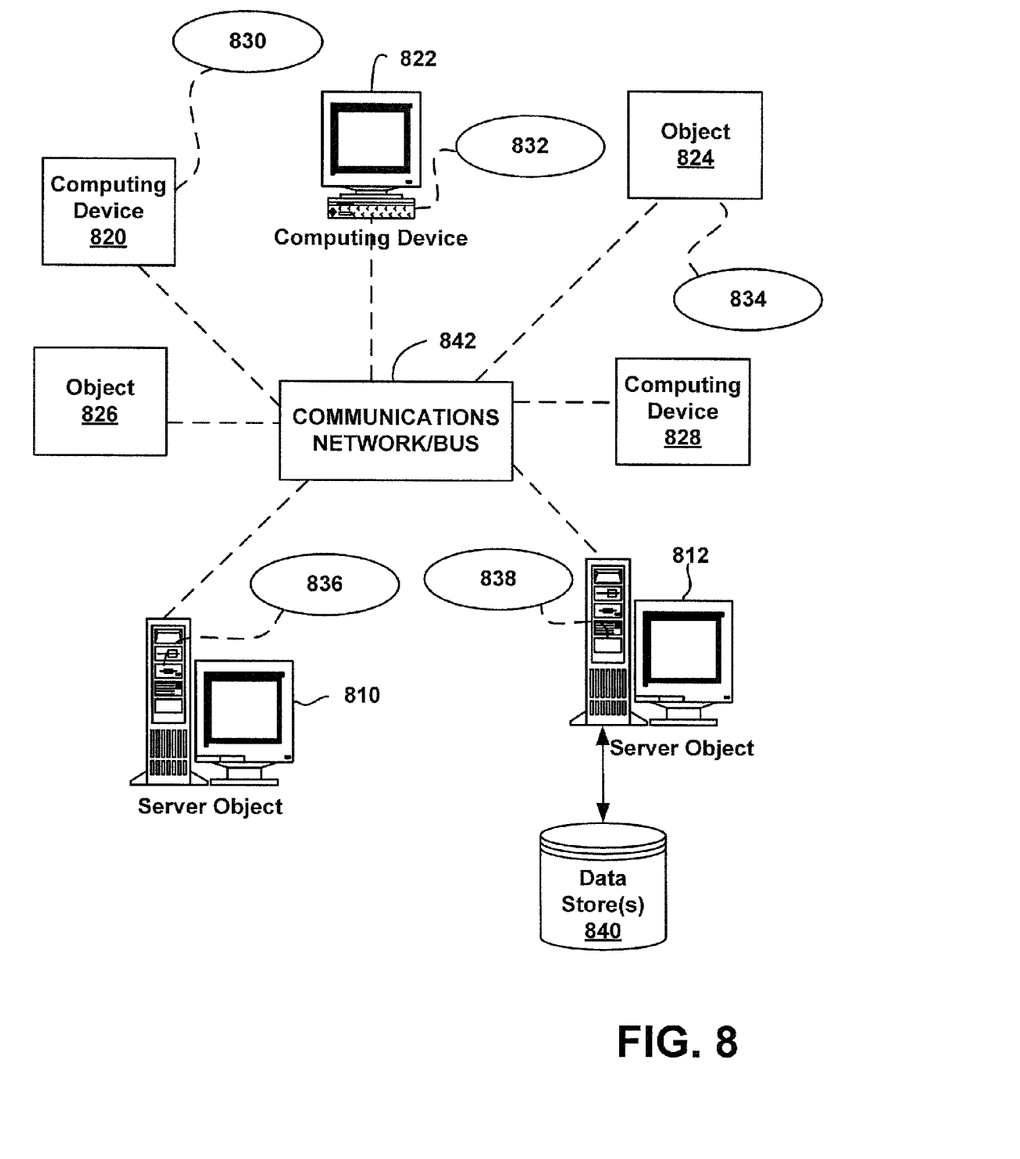
FIG. 8 illustrates a block diagram of an example electronic computing environment that can be implemented in conjunction with one or more aspects described herein.

FIG. 8 provides a schematic diagram of an exemplary networked or distributed computing environment. The distributed computing environment comprises computing objects 810, 812, etc. and computing objects or devices 820, 822, 824, 826, 828, etc., which may include programs, methods, data stores, programmable logic, etc., as represented by applications 830, 832, 834, 836, 838 and data store(s) 840. It can be appreciated that computing objects 810, 812, etc. and computing objects or devices 820, 822, 824, 826, 828, etc. may comprise different devices, including a multimedia display device or similar devices depicted within the illustrations, or other devices such as a mobile phone, personal digital assistant (PDA), audio/video device, MP3 players, personal computer, laptop, etc. It should be further appreciated that data store(s) 840 can include one or more cache memories, one or more registers, or other similar data stores disclosed herein.

Each computing object 810, 812, etc. and computing objects or devices 820, 822, 824, 826, 828, etc. can communicate with one or more other computing objects 810, 812, etc. and computing objects or devices 820, 822, 824, 826, 828, etc. by way of the communications network 842, either directly or indirectly. Even though illustrated as a single element in FIG. 8, communications network 842 may comprise other computing objects and computing devices that provide services to the system of FIG. 8, and/or may represent multiple interconnected networks, which are not shown. Each computing object 810, 812, etc. or computing object or devices 820, 822, 824, 826, 828, etc. can also contain an application, such as applications 830, 832, 834, 836, 838, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 8, as a non-limiting example, computing objects or devices 820, 822, 824, 826, 828, etc. can be thought of as clients and computing objects 810, 812, etc. can be thought of as servers where computing objects 810, 812, etc., acting as servers provide data services, such as receiving data from client computing objects or devices 820, 822, 824, 826, 828, etc., storing of data, processing of data, transmitting data to client computing objects or devices 820, 822, 824, 826, 828, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 842 or bus is the Internet, for example, the computing objects 810, 812, etc. can be Web servers with which other computing objects or devices 820, 822, 824, 826, 828, etc. communicate via any of a number of known protocols, such as the hypertext transfer protocol (HTTP). Computing objects 810, 812, etc. acting as servers may also serve as clients, e.g., computing objects or devices 820, 822, 824, 826, 828, etc., as may be characteristic of a distributed computing environment.

Example Computing Environment

Figure 9:
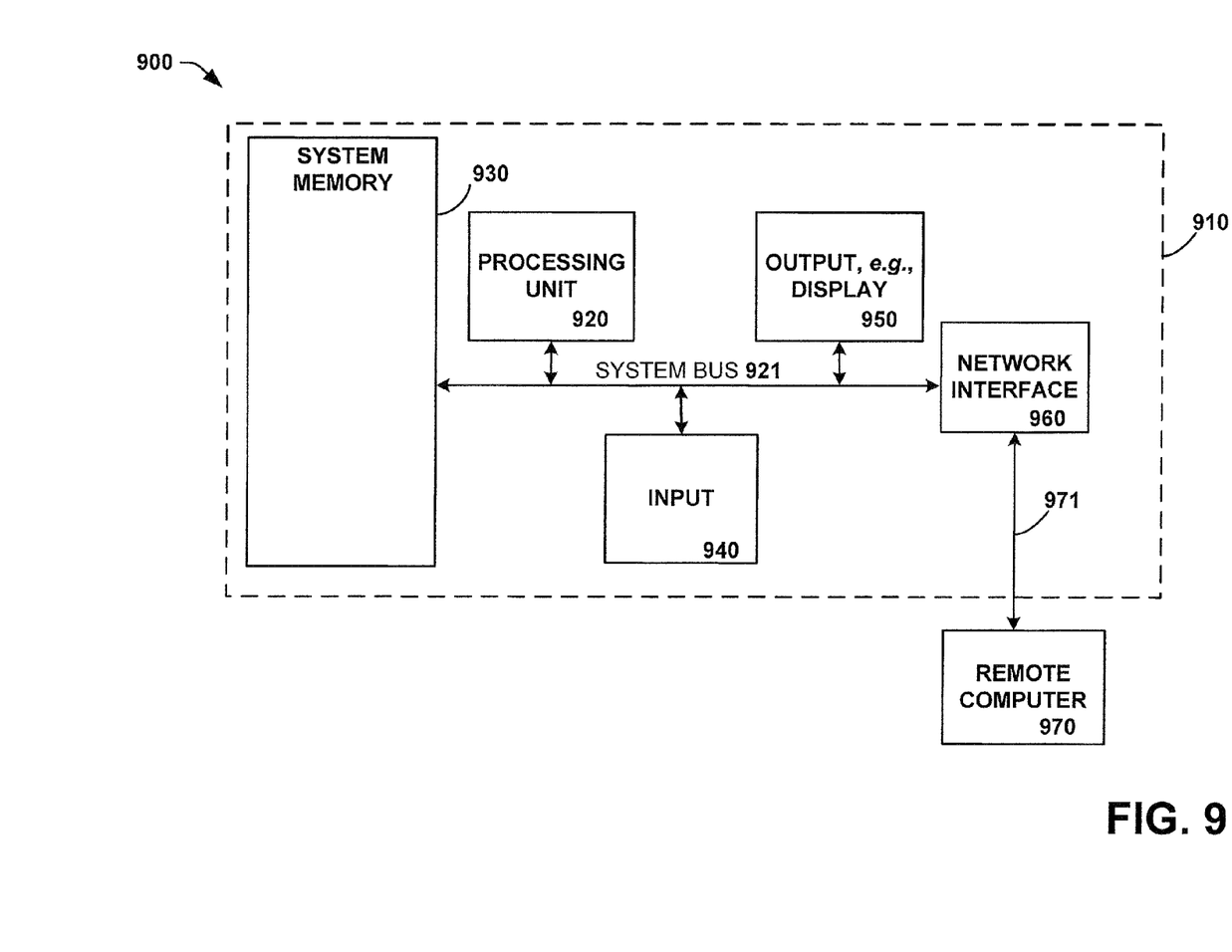
FIG. 9 illustrates a block diagram of an example data communication network that can be operable in conjunction with various aspects described herein.

As mentioned, advantageously, the techniques described herein can be applied to any device and/or network where power management is desirable in a multiprocessor system. It is to be understood, therefore, that handheld, portable and other computing devices and computing objects of all kinds are contemplated for use in connection with the various non-limiting embodiments, i.e., anywhere that a device may wish to implement power management for a multiprocessor system. Accordingly, the below general purpose remote computer described below in FIG. 9 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 9 thus illustrates an example of a suitable computing system environment 900 in which some aspects of the disclosed subject matter can be implemented, although as made clear above, the computing system environment 900 is only one example of a suitable computing environment for a device and is not intended to suggest any limitation as to the scope of use or functionality of the disclosed subject matter. Neither should the computing environment 900 be interpreted as having any dependency or requirement relating to any one or combination of components illustrated in the exemplary operating environment 1300.

With reference to FIG. 9, an exemplary device for implementing the disclosed subject matter includes a general-purpose computing device in the form of a computer 910. Components of computer 910 may include, but are not limited to, a processing unit 920, a system memory 930, and a system bus 921 that couples various system components including the system memory to the processing unit 920. The system bus 921 may be any of several types of bus structures including a memory bus or memory controller, a peripheral bus, and a local bus using any of a variety of bus architectures.

Computer 910 typically includes a variety of computer readable media. Computer readable media can be any available media that can be accessed by computer 910. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 910. Communication media typically embodies computer readable instructions, data structures, program modules, or other data in a modulated data signal such as a carrier wave or other transport mechanism and includes any information delivery media.

The system memory 930 may include computer storage media in the form of volatile and/or nonvolatile memory such as read only memory (ROM) and/or random access memory (RAM). A basic input/output system (BIOS), containing the basic routines that help to transfer information between elements within computer 910, such as during start-up, may be stored in memory 930. Memory 930 typically also contains data and/or program modules that are immediately accessible to and/or presently being operated on by processing unit 920. By way of example, and not limitation, memory 930 may also include an operating system, application programs, other program modules, and program data.

The computer 910 may also include other removable/non-removable, volatile/nonvolatile computer storage media. For example, computer 910 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 921 through a non-removable memory interface such as an interface, and a magnetic disk drive or optical disk drive is typically connected to the system bus 921 by a removable memory interface, such as an interface.

A user can enter commands and information into the computer 910 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 920 through user input 940 and associated interface(s) that are coupled to the system bus 921, but may be connected by other interface and bus structures, such as a parallel port, game port, or a universal serial bus (USB). A graphics subsystem can also be connected to the system bus 921. A projection unit in a projection display device, or a HUD in a viewing device or other type of display device can also be connected to the system bus 921 via an interface, such as output interface 950, which may in turn communicate with video memory. In addition to a monitor, computers can also include other peripheral output devices such as speakers which can be connected through output interface 950.

The computer 910 can operate in a networked or distributed environment using logical connections to one or more other remote computer(s), such as remote computer 970, which can in turn have media capabilities different from device 910. The remote computer 970 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 910. The logical connections depicted in FIG. 9 include a network 971, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 910 can be connected to the LAN 971 through a network interface or adapter. When used in a WAN networking environment, the computer 910 can typically include a communications component, such as a modem, or other means for establishing communications over the WAN, such as the Internet. A communications component, such as wireless communications component, a modem and so on, which can be internal or external, can be connected to the system bus 921 via the user input interface of input 940, or other appropriate mechanism. In a networked environment, program modules depicted relative to the computer 910, or portions thereof, can be stored in a remote memory storage device. It will be appreciated that the network connections shown and described are exemplary and other means of establishing a communications link between the computers can be used.

Reference throughout this specification to "one embodiment," "an embodiment," "an example", "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one example," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Unless otherwise indicated, all numbers, values and/or expressions referring to characteristics (e.g. speed) used in the specification and claims are to be understood as modified in all instances by the term "about."

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. An error correction system, comprising:
a memory storing executable components; and
a processor, communicatively coupled to the memory, that facilitates execution of executable components, the executable components comprising:
a concatenation component configured for stacking a plurality of forward error correction bits on top of each other in a matrix arrangement with a plurality of binary code, wherein a symbol size of the forward error correction bits is smaller than a sample size of the binary code;
an encoding component configured for generating an encoded bit for each product of a forward error correction bit of the plurality of forward error correction bits and a code of the plurality of binary code;
a forward error correction decoder that is configured for generating decoded bits by decoding the encoded bits using a hexacode, wherein a portion of the encoded bits are not successfully decoded; and
a multilevel decoding leech lattice that is configured for receiving the decoded bits and the encoded bits from the forward error correction decoder, wherein the multilevel decoding leech lattice and the forward error correction decoder iteratively decode the encoded bits until all the encoded bits are decoded.

2. The error correction system of claim 1, wherein there are less than six encoded bits for each code of the plurality of binary code.

3. The error correction system of claim 1, wherein each of the encoded bits generated by the encoding component comprises a forward error correction code.

4. The error correction system of claim 1, further comprising a digital to analog converter component configured for receiving a plurality of symbols corresponding to the encoded bits, and converting the plurality of symbols to an analog transmission and transmitting the analog transmission over a cable assembly of at least two pairs of twinax cables.

5. The error correction system of claim 4, further comprising an analog to digital converter component configured for receiving the analog transmission and converting the analog transmission back into the plurality of symbols corresponding to the encoded bits.

6. The error correction system of claim 1, wherein the forward error correction bits comprise a portion of at least a partially known hexacode.

7. The error correction system of claim 1, further comprising a forward error correction code rate component configured for setting a symbol rate for processing constellations of modulated points into a plurality of symbols.

8. The error correction system of claim 1, wherein a latency of the iterative decoding is based on a difference in the symbol size of the forward error correction bits and the sample size of the binary code.

9. A receiver device comprising:
a memory to store computer-executable components; and
a processor, coupled to the memory, that facilitates execution of computer-executable components, the computer-executable components comprising:
an analog to digital converter component configured for receiving an analog transmission and converting the analog transmission into a plurality of symbols corresponding to encoded bits;
a forward error correction decoder that is configured for decoding the encoded bits using a hexacode, wherein a portion of the encoded bits are not successfully decoded; and
a multilevel decoding leech lattice that is configured for receiving the decoded bits and the encoded bits from the forward error correction decoder and iteratively decoding and passing the encoded bits back to the forward error correction decoder until all the encoded bits are decoded.

10. The receiver device of claim 9, wherein a latency of the iterative decoding is based on a difference in a symbol size of the forward error correction bits and a sample size of the binary code.

11. The receiver device of claim 9, wherein the encoded bits are generated based on a product of a forward error correction bit and a code of a plurality of binary code, and there are less than six encoded bits for each code of the plurality binary code.

12. An error correction method, comprising:
stacking, by a device with a processor, a plurality of forward error correction bits on top of each other in a matrix arrangement with a plurality of binary code, wherein a symbol size of the forward error correction bits is smaller than a sample size of the plurality of binary code;
generating an encoded bit for each product of a forward error correction bit of the plurality of forward error correction bits and a code of the plurality of binary code;
decoding, by a forward correction decoder, the encoded bits using a hexacode, wherein a portion of the encoded bits are not successfully decoded; and
receiving, by a multilevel decoding leech lattice, the decoded bits and the encoded bits from the forward error correction decoder, and the multilevel decoding leech lattice and the forward error correction decoder iteratively decode the encoded bits until all the encoded bits are decoded.

13. The error correction method of claim 12, wherein there are less than six encoded bits for each code of the plurality of binary code.

14. The error correction method of claim 12, further comprising:
setting a symbol rate for processing constellations of modulated points into a plurality of symbols.

15. The error correction method of claim 12, further comprising:
receiving a plurality of symbols corresponding to the encoded bits; and
converting the plurality of symbols to an analog transmission and transmitting the analog transmission over a cable assembly of at least one pair of twinax cables.

16. The error correction method of claim 15, further comprising:
receiving the analog transmission and converting the analog transmission back into the plurality of symbols corresponding to the encoded bits.

* * * * *